United States Patent
Taguchi

(10) Patent No.: US 9,600,039 B2
(45) Date of Patent: Mar. 21, 2017

(54) ELECTRONIC DEVICE

(71) Applicant: FUJITSU LIMITED, Kawasaki-shi, Kanagawa (JP)

(72) Inventor: Jun Taguchi, Miura (JP)

(73) Assignee: FUJITSU LIMITED, Kawasaki (JP)

( * ) Notice: Subject to any disclaimer, the term of this patent is extended or adjusted under 35 U.S.C. 154(b) by 53 days.

(21) Appl. No.: 14/456,155

(22) Filed: Aug. 11, 2014

(65) Prior Publication Data

US 2015/0049430 A1  Feb. 19, 2015

(30) Foreign Application Priority Data

Aug. 15, 2013 (JP) ................................ 2013-168982

(51) Int. Cl.
*H05K 7/20* (2006.01)
*G06F 1/20* (2006.01)

(52) U.S. Cl.
CPC ............. *G06F 1/20* (2013.01); *H05K 7/2039* (2013.01); *H05K 7/20772* (2013.01)

(58) Field of Classification Search
None
See application file for complete search history.

(56) References Cited

U.S. PATENT DOCUMENTS

| | | | |
|---|---|---|---|
| 6,313,995 B1 | 11/2001 | Koide et al. | |
| 6,490,161 B1 * | 12/2002 | Johnson | H01L 23/4006 165/185 |
| 7,310,227 B2 * | 12/2007 | Kusamoto | G06F 1/203 174/16.1 |
| 2005/0117307 A1 * | 6/2005 | Tanaka | H01L 23/4006 361/719 |
| 2008/0239667 A1 * | 10/2008 | Tanaka | G06F 1/203 361/695 |
| 2008/0302509 A1 | 12/2008 | Chen et al. | |
| 2009/0154110 A1 * | 6/2009 | Ma | H01L 23/4006 361/719 |
| 2009/0168355 A1 * | 7/2009 | Ma | H01L 23/3672 361/709 |

FOREIGN PATENT DOCUMENTS

JP    2009-147382    7/2009

OTHER PUBLICATIONS

Extended European Search Report dated May 3, 2016 in corresponding European Patent Application No. 14179772.0, 9 pages.

\* cited by examiner

*Primary Examiner* — Courtney Smith

(74) *Attorney, Agent, or Firm* — Staas & Halsey LLP

(57) ABSTRACT

An electronic device is described, which includes: a first cooling member having a first overlapping portion in which a first insertion hole is formed, and provided to be abutted on a first component to be cooled provided on a substrate; a second cooling member having a second overlapping portion in which a second insertion hole is formed, and provided to be abutted on a second component to be cooled provided on the substrate, the second overlapping portion overlapping the first overlapping portion; and a coupling member inserted through the first insertion hole and the second insertion hole to couple the first overlapping portion to the second overlapping portion through an elastic member.

6 Claims, 10 Drawing Sheets

100

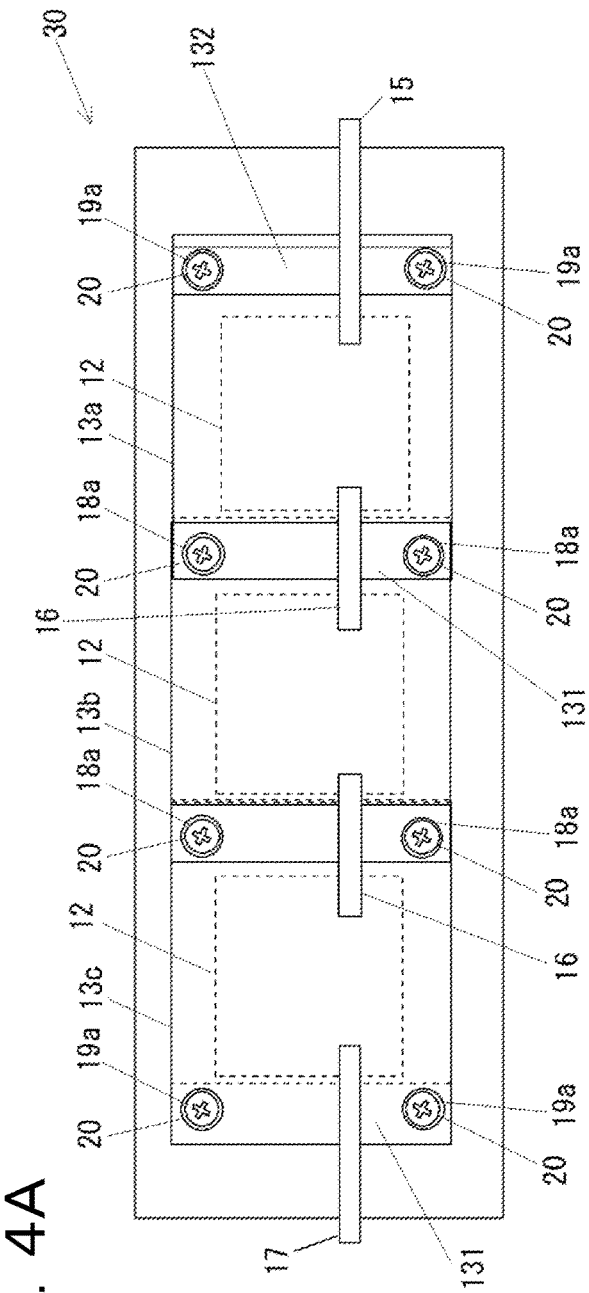
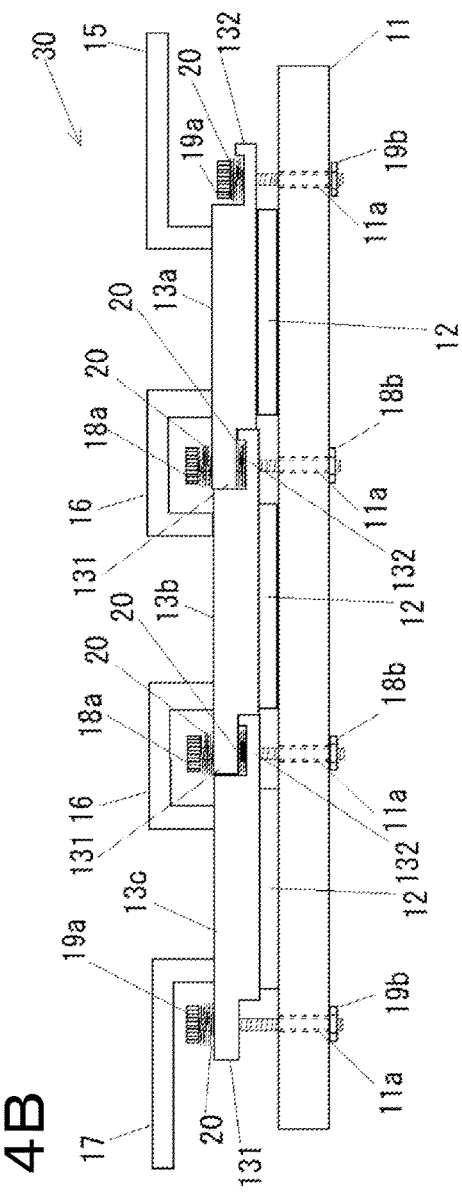
FIG. 4A
FIG. 4B

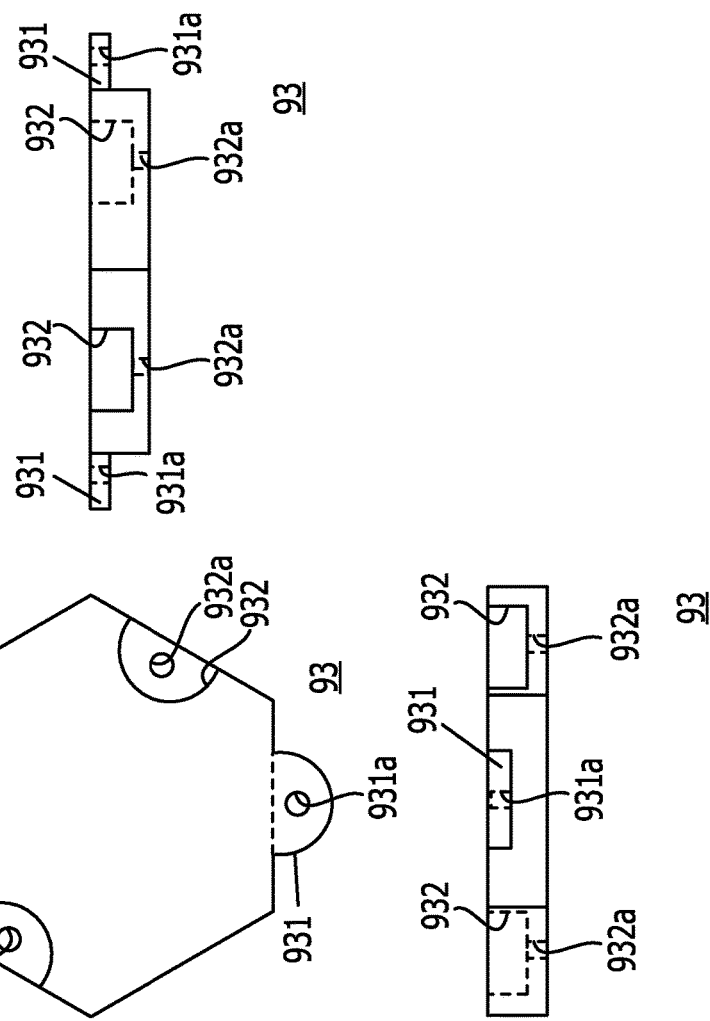
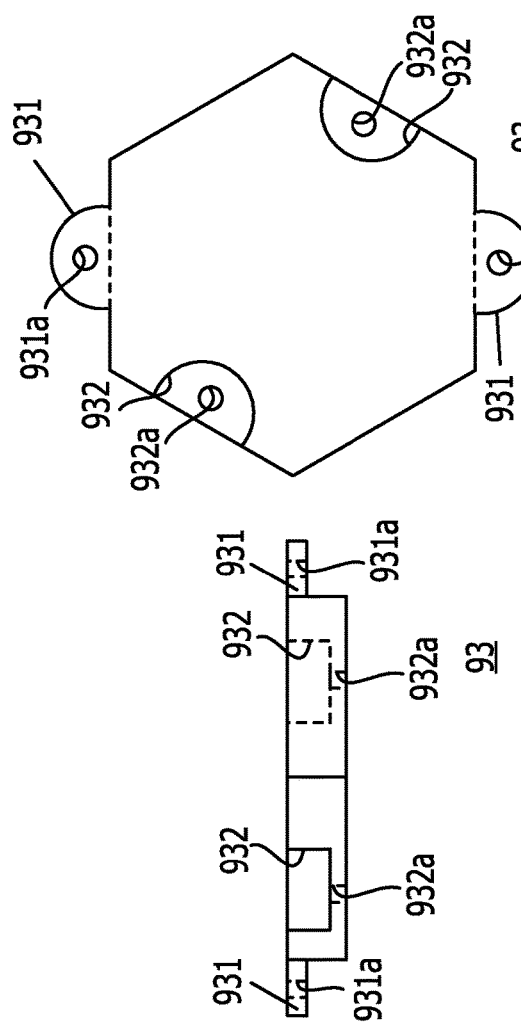

ELECTRONIC DEVICE

CROSS-REFERENCE TO RELATED APPLICATIONS

This application is based upon and claims the benefit of priority of the prior Japanese Patent Application No. 2013-168982 filed on Aug. 15, 2013, the entire contents of which are incorporated herein by reference.

FIELD

Exemplary embodiments of the present disclosure relate to an electronic device required to be cooled.

BACKGROUND

In various electronic devices such as, for example, an electronic computer or an information processing device, high-density mounting has recently been progressed. In this background, a plurality of high heat-generating electronic components may be mounted on a substrate. A heating amount itself of electronic components tends to be increased, and a heating density on the substrate has been increased. In order to cool such an electronic device, various kinds of cooling devices have been suggested. For example, there is known a technology of improving the mounting efficiency of the electronic components and the cooling devices (see, e.g., Patent Document 1).

[Patent Document 1] Japanese Laid-Open Patent Publication No. 2009-147382

However, there is room for further improvement of conventional electronic devices, including an electronic device disclosed in Japanese Laid-Open Patent Publication No. 2009-147382, in terms of a mounting efficiency.

Therefore, an electronic device disclosed herein is to improve a mounting efficiency of a substrate. Besides this object, another object of the present disclosure is to achieve an acting effect which has not been achieved by a conventional technology, by configurations in exemplary embodiments to be described later.

SUMMARY

According to the present disclosure, there is provided an electronic device comprising: a first cooling member including a first overlapping portion in which a first insertion hole is formed, and provided to be abutted on a component to be cooled provided on a substrate; a second cooling member including a second overlapping portion in which a second insertion hole is formed, and provided to be abutted on a component to be cooled provided on the substrate, the second overlapping portion overlapping the first overlapping portion; and a coupling member inserted through the first insertion hole and the second insertion hole to couple the first overlapping portion to the second overlapping portion through an elastic member.

The first cooling member and the second cooling member coupled to each other through the coupling member are mounted on the substrate. Thus, the fixing regions on both sides of the substrate may be reduced, and the reduced regions may be a wiring region or a mounting region, thereby improving a mounting efficiency of the substrate.

The object and advantages of the invention will be realized and attained by means of the elements and combinations particularly pointed out in the claims. It is to be understood that both the foregoing general description and the following detailed description are exemplary and explanatory and are not restirctive of the invention, as claimed.

BRIEF DESCRIPTION OF DRAWINGS

FIG. 3A is a plan view, FIG. 3B is a front view, FIG. 3C is a right side view, and FIG. 3D is a left side view.

FIG. 4A is a plan view of a cooling device provided in an electronic device of a second exemplary embodiment, and FIG. 4B is a front view of the cooling device.

FIG. 6A is a plan view, FIG. 6B is a front view, FIG. 6C is a right side view, and FIG. 6D is a left side view.

FIG. 8A is a plan view, FIG. 8B is a front view, FIG. 8C is a right side view, and FIG. 8D is a left side view.

FIGS. 10A to 10D are views illustrating four sides of a cooling plate provided in the electronic device of the fifth exemplary embodiment. FIG. 10A is a plan view, FIG. 10B is a front view, FIG. 10C is a right side view, and FIG. 10D is a left side view.

DESCRIPTION OF EMBODIMENTS

Figure 1:
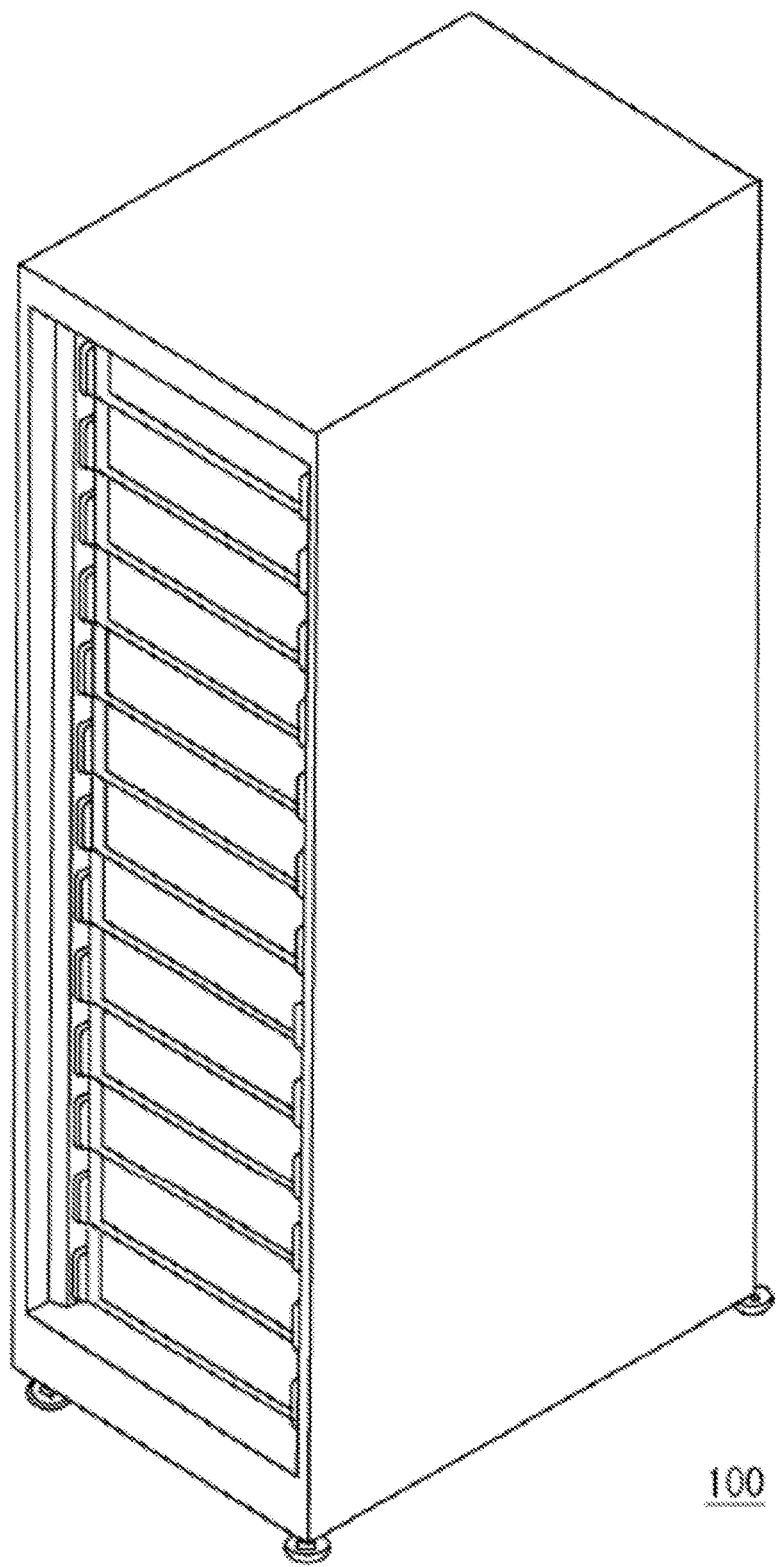
FIG. 1 is an explanatory view illustrating an electronic device of a first exemplary embodiment.

Hereinafter, exemplary embodiments of the present disclosure will be described with reference to accompanying drawings. In the drawings, for example, the size and the ratio of each illustrated part may not completely correspond to those of a real part. Further, in some drawings, for the convenience of description, actually existing elements may be omitted, or some elements may be illustrated in an exaggerated size as compared to an actual size.

First Exemplary Embodiment

Figure 2A:
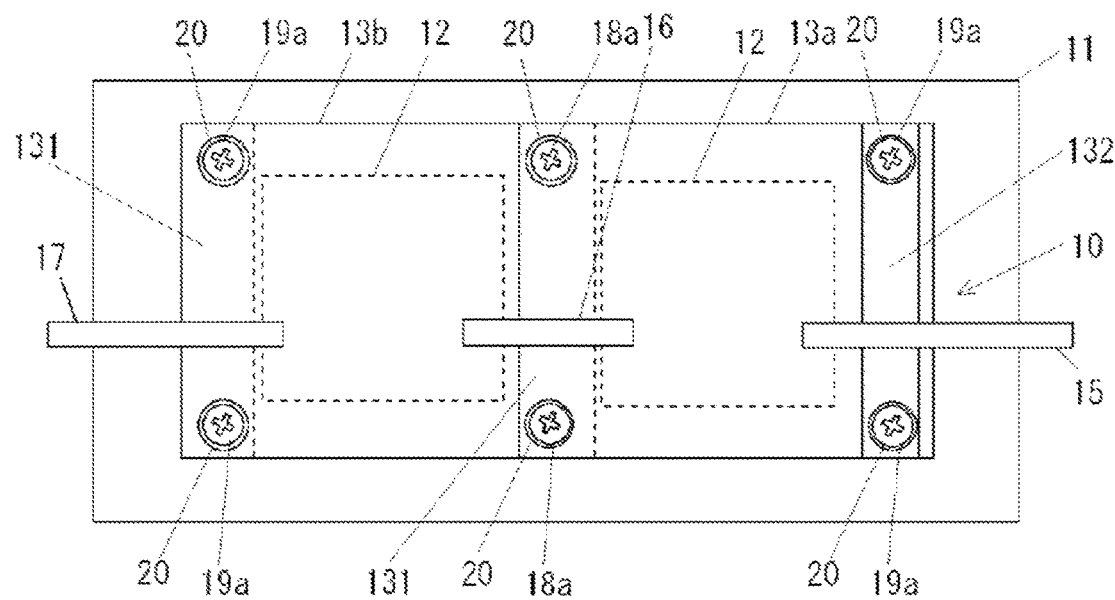
FIG. 2A is a plan view of a cooling device provided in the electronic device of the first exemplary embodiment.
Figure 2B:
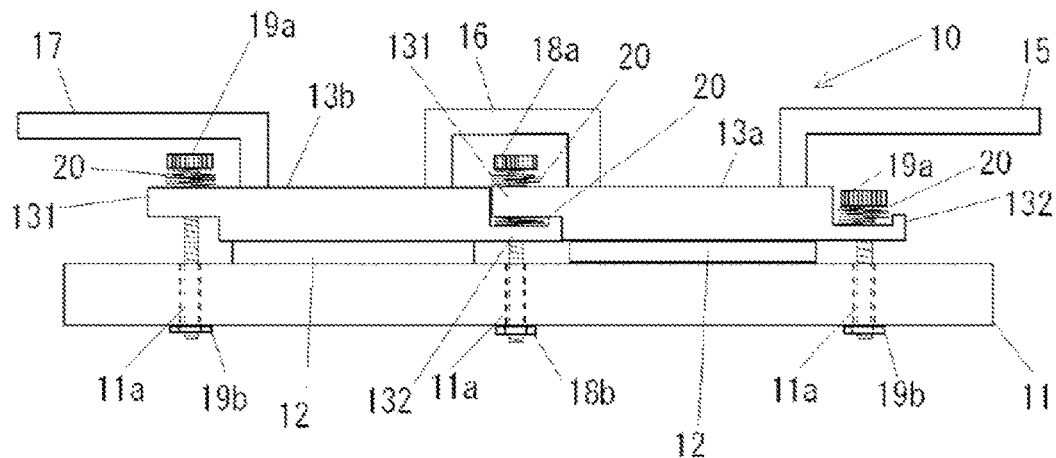
FIG. 2B is a front view of the cooling device.
Figure 3C:
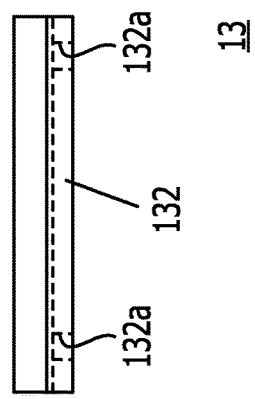
FIGS. 3A to 3D are views illustrating four sides of a cooling plate provided in the electronic device of the first exemplary embodiment.
Figure 3A:
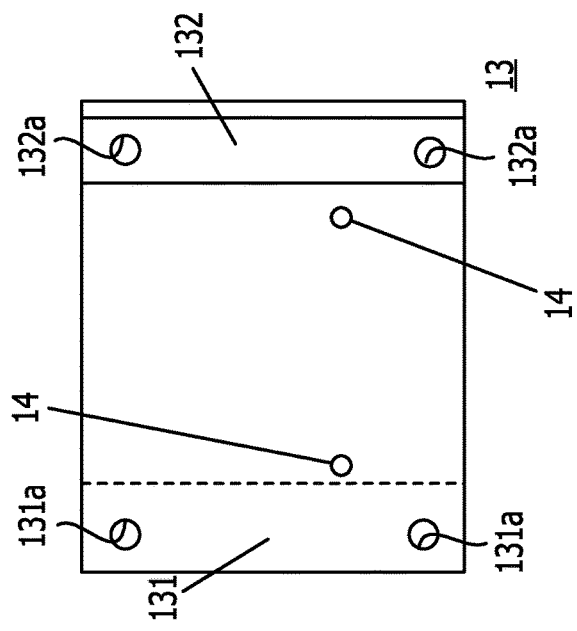
Figure 3B:
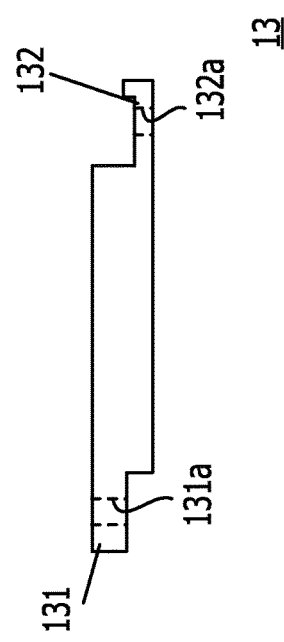
Figure 3D:
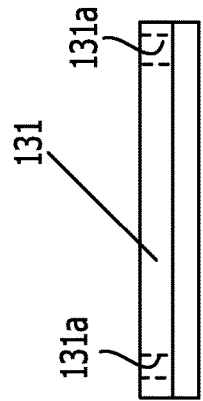

First, an electronic device 100 of a first exemplary embodiment will be described with reference to FIGS. 1 to 3. FIG. 1 is an explanatory view illustrating the electronic device 100 of the first exemplary embodiment. FIG. 2A is a plan view of a cooling device 10 provided in the electronic device 100 of the first exemplary embodiment, and FIG. 2B is a front view of the cooling device 10. FIGS. 3A to 3D are views illustrating four sides of a cooling plate 13 provided in the electronic device 100 of the first exemplary embodiment. FIG. 3A is a plan view, FIG. 3B is a front view, FIG. 3C is a right side view, and FIG. 3D is a left side view.

Referring to FIG. 1, the electronic device 100 of the first exemplary embodiment is an information processing device such as, for example, a server. The electronic device 100 includes many printed circuit boards 11 therein. As an electronic device, another device may be targeted. Referring to FIGS. 2A and 2B, respective components to be cooled, that is, electronic components 12 which are heat-generating components required to be cooled are mounted on a substrate 11 to be adjacent to each other. The electronic components 12 required to be cooled include, for example, a large scale integrated circuit (LSI) for interconnect, and a central processing unit (CPU). Other components may be the electronic components 12 to be cooled. The cooling device 10 is mounted on the substrate 11. The cooling device 10 includes two cooling plates 13. Specifically, the cooling device 10 includes a first cooling plate 13a corresponding to a first cooling member, and a second cooling plate 13b corresponding to a second cooling member. Both the first cooling plate 13a and the second cooling plate 13b are cooling plates 13, and have the same shape. The cooling plates 13 include coolant introducing/discharging outlets 14, and cool the electronic components 12 by circulating a coolant within the cooling plates 13. Any one of a coolant introducing pipe 15, a connecting pipe 16, and a coolant introducing/discharging pipe 17 is attached to each of the coolant introducing/discharging outlets 14 to circulate the coolant within each of the first cooling plate 13a and the second cooling plate 13b. Referring to FIGS. 3A and 3B, the cooling plates 13 will be described.

Each cooling plate 13 includes a first overlapping portion 131 having first insertion holes 131a formed therein. The cooling plate 13 includes a second overlapping portion 132 having second insertion holes 132a formed therein. Each of the first insertion holes 131a and the second insertion holes 132a may be formed in a shape in which a coupling screw 18a to be described below may be inserted there through, or formed in a shape of a partially opened notch.

The first overlapping portion 131 and the second overlapping portion 132 are formed as stepped portions which are engaged with each other. Specifically, the first overlapping portion 131 is formed as a stepped portion thinner than its peripheral portion so that the second overlapping portion 132 may be disposed below the first overlapping portion 131. The second overlapping portion 132 at one side is formed as a stepped portion thinner than its peripheral portion so that the first overlapping portion 131 may be disposed above the second overlapping portion 132. The second overlapping portion 132 is formed in a concave shape to accommodate an elastic member 20 to be described later. Since the first overlapping portion 131 and the second overlapping portion 132 are formed as stepped portions, the thickness of the first cooling plate 13a and the second cooling plate 13b which overlap each other may be reduced.

The cooling plate 13 is prepared as each of the first cooling plate 13a and the second cooling plate 13b which is provided to be abutted on the electronic component 12 provided on the substrate 11. The first overlapping portion 131 and the second overlapping portion 132 overlap each other and are coupled to each other by coupling screws 18a and fixing nuts 18b through the elastic members 20. Here, the coupling screws 18a and the fixing nuts 18b correspond to coupling members. The coupling screws 18a are inserted through the first insertion holes 131a, the second insertion holes 132a and third insertion holes 11a provided in the substrate 11 to tighten the fixing nuts 18b. That is, the coupling screws 18a are fixed to the substrate 11. The first overlapping portion 131 and the second overlapping portion 132 are fastened and coupled to each other in this manner, and thus the first cooling plate 13a and the second cooling plate 13b are integrated to be fixed to the substrate 11. Accordingly, the number of members to be used for fixing the first cooling plate 13a and the second cooling plate 13b to the substrate 11 may be reduced. That is, the fixing regions on both sides of the substrate 11 may be reduced by mounting the first cooling plate 13a and the second cooling plate 13b which are coupled to each other through the coupling screws 18a and the fixing nuts 18b, on the substrate 11. The regions corresponding to the reduced fixing regions may be used as a wiring region or a mounting region, thereby improving a mounting efficiency of the substrate 11. For example, when four corners of the rectangular cooling plate 13 are screwed, eight screwing locations are required to fix two cooling plates 13 to the substrate 11. In contrast, in the cooling device 10 of the first exemplary embodiment, since screwing is carried out at six locations, regions for two locations may be reduced. Further, the electronic components 12 may be disposed to be adjacent to each other, thereby improving the mounting density.

Referring to FIGS. 2A and 2B, an elastic member 20 is interposed between a head portion of each coupling screw 18a and the first overlapping portion 131. Such an elastic member 20 is also interposed between the first overlapping portion 131 and the second overlapping portion 132. These elastic members 20 enhance the flexibility of a posture of the first cooling plate 13a and the second cooling plate 13b. The electronic components 12 may be different from each other in height or surface smoothness. Angles of the top surfaces of the electronic components 12 with respect to the substrate surface may be varied. It is preferable that the cooling plates 13 are brought into close contact with the top surfaces of the electronic components 12 as much as possible to increase a cooling efficiency. The cooling device 10 includes the first cooling plate 13a and the second cooling plate 13b, and flexibly changes the posture of each of the first cooling plate 13a and the second cooling plate 13b so as to secure adhesion to the electronic components 12.

The cooling device 10 includes fixing screws 19a and fixing nuts 19b configured to fix each of the first cooling plate 13a and the second cooling plate 13b to the substrate 11 through the elastic members 20. The fixing screws 19a are inserted through the elastic members 20, and inserted through the first insertion holes 131a or the second insertion holes 132a. The fixing screws 19a inserted through the first insertion holes 131a or the second insertion holes 132a are inserted through the third insertion holes 11a provided in the substrate 11. The fixing nuts 19b are fastened to the fixing screws 19a. The fixing screws 19a and the fixing nuts 19b correspond to fixing members. The posture of each of the first cooling plate 13a and the second cooling plate 13b may be flexibly varied by interposing the elastic members 20 therebetween. Accordingly, an adhesion of each of the first cooling plate 13a and the second cooling plate 13b to the electronic component 12 is increased, thereby improving the cooling efficiency.

In this manner, in the cooling device 10, a part of the first cooling plate 13a and a part of the second cooling plate 13b overlap each other while the first cooling plate 13a and the second cooling plate 13b are coupled to each other by the coupling screws 18a and the fixing nuts 18b through the elastic members 20. Each of the first cooling plate 13a and the second cooling plate 13b is provided to be abutted on the electronic component 12 provided the substrate 11. Accordingly, the mounting efficiency of the substrate 11 may be improved, and a high cooling effect may be achieved.

The cooling device 10 of the first exemplary embodiment uses the cooling plates 13 configured to circulate a coolant. However, instead of the cooling plates 13, a heat sink having heat dissipating fins may be employed. In the first exemplary embodiment, coil springs are employed as the elastic members. However, instead of the coil springs, other conventionally known spring materials may be used. Although omitted in the first exemplary embodiment, flexible cooling sheets may be disposed between the electronic components 12 and the cooling plates 13 in order to improve a thermal conductivity.

Second Exemplary Embodiment

A cooling device 30 of a second exemplary embodiment will be described with reference to FIGS. 4A and 4B. FIG. 4A is a plan view of the cooling device 30 provided in an electronic device 100 of the second exemplary embodiment, and FIG. 4B is a front view of the cooling device 30. The cooling device 30 of the second exemplary embodiment is different from the cooling device 10 of the first exemplary embodiment in the following features. That is, the cooling device 10 includes two cooling plates 13 coupled to each other, while the cooling device 30 includes three cooling plates 13 coupled to each other in series. Specifically, the cooling device 30 includes a first cooling plate 13a, a second cooling plate 13b, and a third cooling plate 13c. In the cooling device 30, the relationship between the second cooling plate 13b and the third cooling plate 13c corresponds to the relationship between the first cooling plate 13a and the second cooling plate 13b. In this manner, the number of the cooling plates 13 coupled to each other in series may be increased. Even when the number of the cooling plates 13 is increased, the number of members used for fixing each of the cooling plates 13 to the substrate 11 may be reduced because a first overlapping portion 131 and a second overlapping portion 132 are engaged with each other at an overlapping location of the first overlapping portion 131 and the second overlapping portion 132. Also, since the flexibility of posture of each cooling plate 13 is improved, the adhesion of the cooling plate 13 in relation to an electronic component 12 may be improved, and the cooling efficiency may also be improved.

Some elements which are common to those in the first exemplary embodiment are given the same reference numerals in drawings, and detailed descriptions thereof will be omitted. Such handling in the description of the second exemplary embodiment will be the same in descriptions of respective following exemplary embodiments.

Third Exemplary Embodiment

Figure 5A:
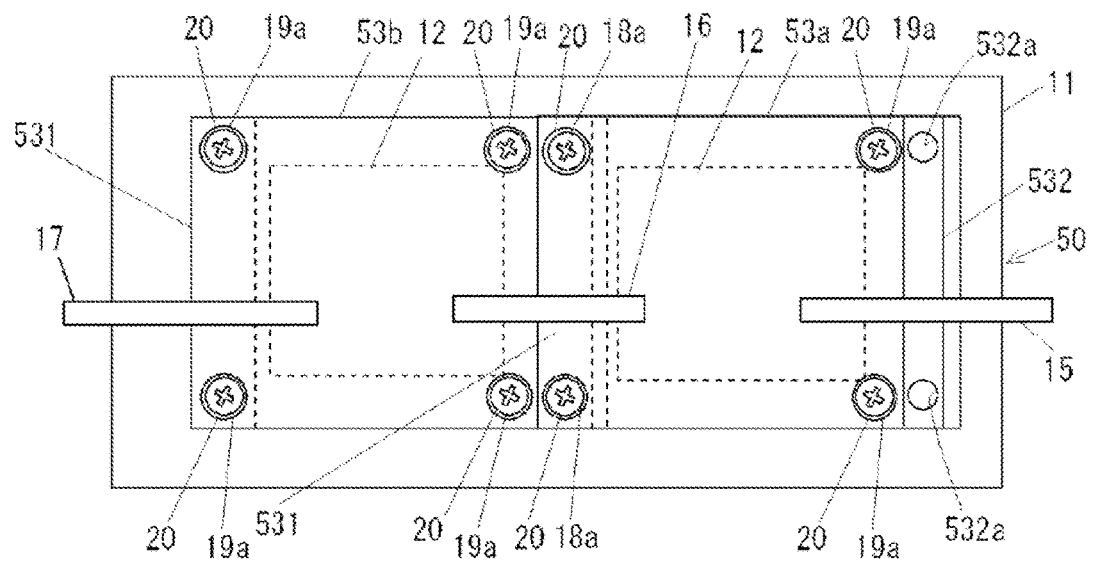
FIG. 5A is a plan view of a cooling device provided in an electronic device of a third exemplary embodiment.
Figure 5B:
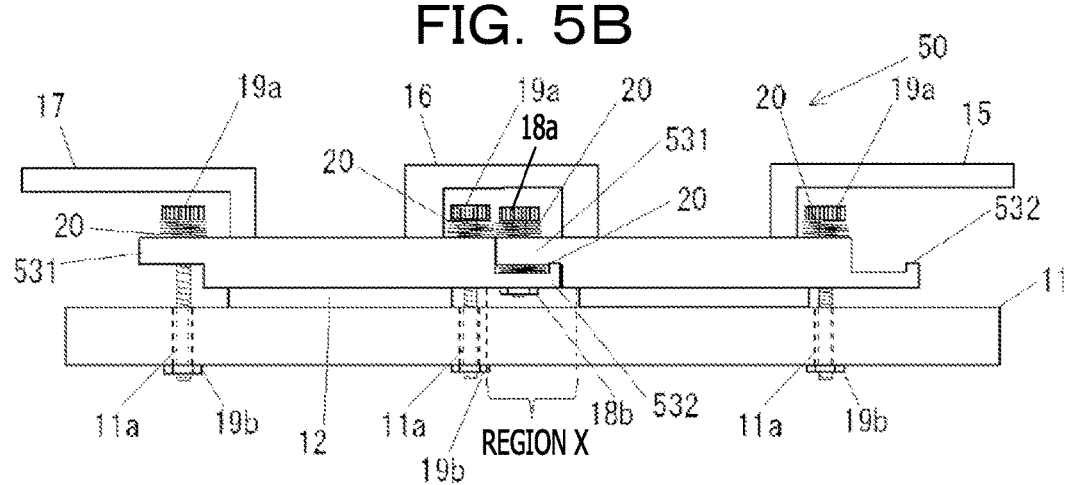
FIG. 5B is a front view of the cooling device.
Figure 6C:
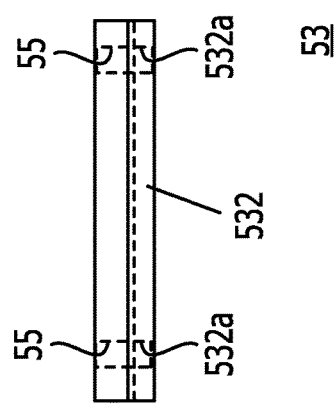
FIGS. 6A to 6D are views illustrating four sides of a cooling plate provided in the electronic device of the third exemplary embodiment.
Figure 6A:
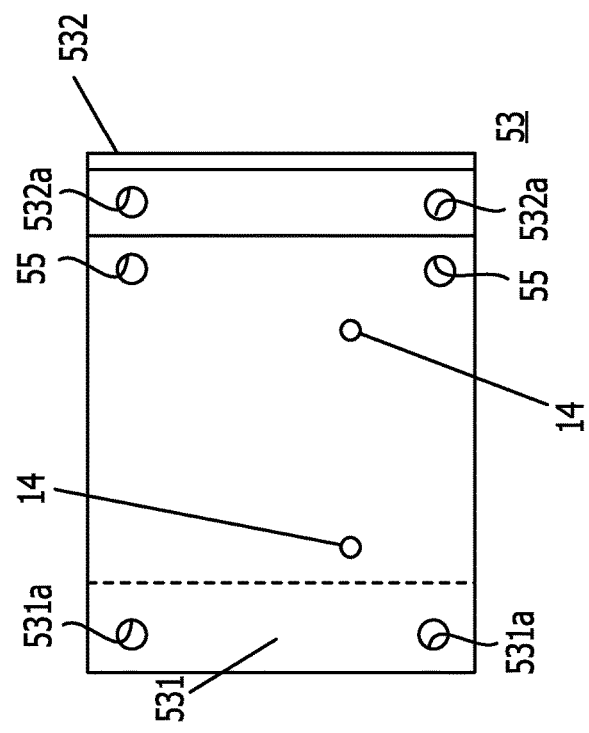
Figure 6B:
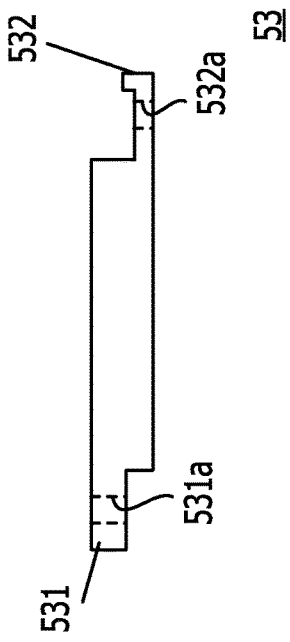
Figure 6D:
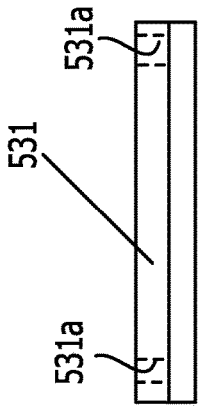

A cooling device 50 of a third exemplary embodiment will be described with reference to FIGS. 5A to 6D. FIG. 5A is a plan view of the cooling device 50 provided in an electronic device 100 of the third exemplary embodiment, and FIG. 5B is a front view of the cooling device 50. FIGS. 6A to 6D are views illustrating four sides of a cooling plate 53 provided in the electronic device of the third exemplary embodiment. FIG. 6A is a plan view, FIG. 6B is a front view, FIG. 6C is a right side view, and FIG. 6D is a left side view.

The cooling plate 53 of the third exemplary embodiment includes a first overlapping portion 531 and a second overlapping portion 532 in the same manner as in the cooling plate 13 of the first exemplary embodiment. First insertion holes 531a are provided in the first overlapping portion 531, and second insertion holes 532a are provided in the second overlapping portion 532. Insertion holes 55 through which fixing screws 19a are inserted are additionally provided in the cooling plate 53. Referring to FIGS. 5A and 5B, a first cooling plate 53a and a second cooling plate 53b are coupled through coupling screws 18a and fixing nuts 18b while a first overlapping portion 531 of the first cooling plate 53a and a second overlapping portion 532 of the second cooling plate 53b overlap each other. The first cooling plate 53a and the second cooling plate 53b coupled to each other by the coupling screws 18a and the fixing nuts 18b are fixed to a substrate 11 by the fixing screws 19a and the fixing nuts 19b at six locations. Unlike in the first exemplary embodiment, the coupling screws 18a are not inserted through third insertion holes 11a provided in the substrate 11. Accordingly, the region X indicated in FIG. 5B may be used as a wiring region or a component mounting region. In this manner, the cooling device 50 of the third exemplary embodiment may improve the mounting efficiency of the substrate 11 in the same manner as the first exemplary embodiment.

Fourth Exemplary Embodiment

Figure 7A:
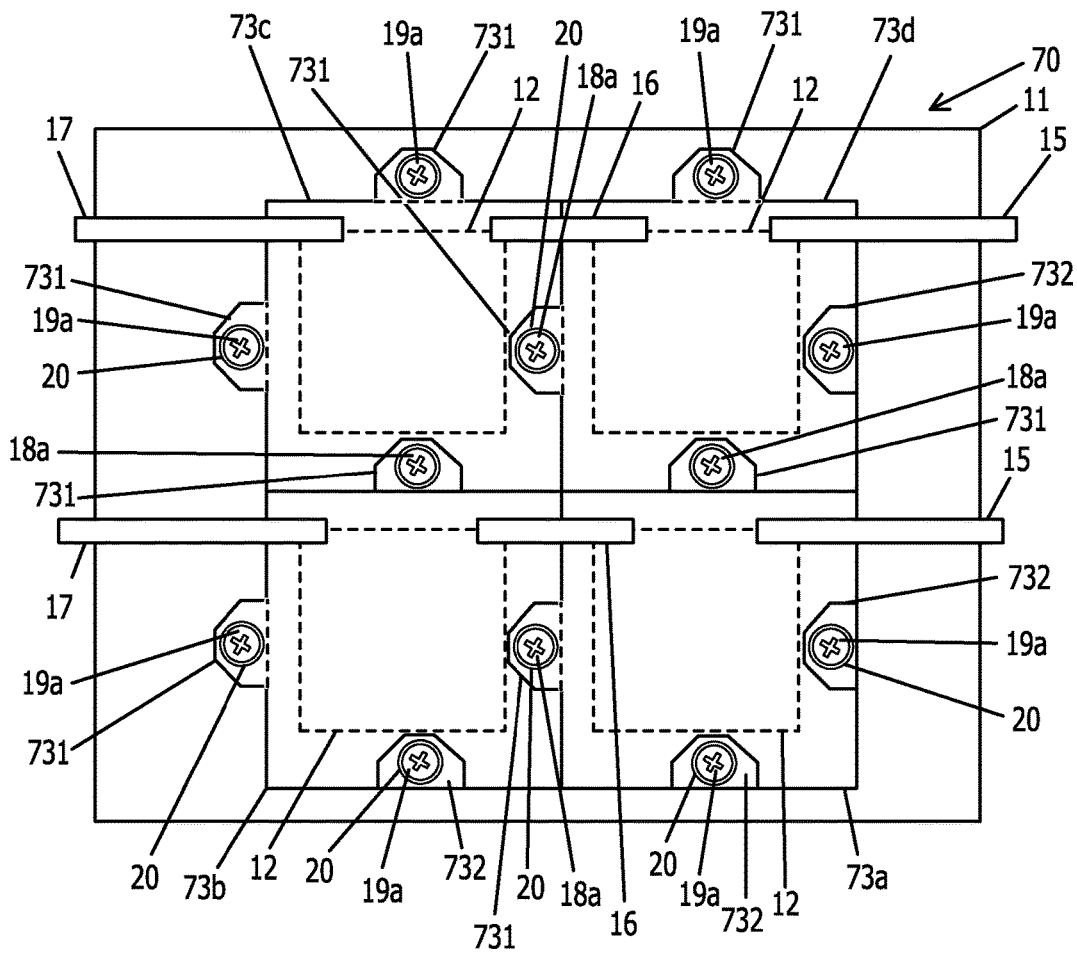
FIG. 7A is a plan view of a cooling device provided in an electronic device of a fourth exemplary embodiment.
Figure 7B:
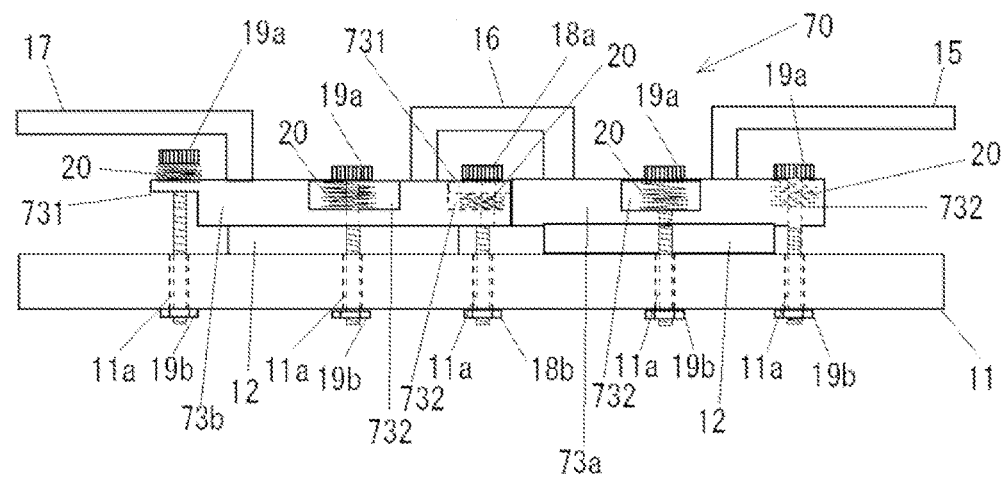
FIG. 7B is a front view of the cooling device.
Figure 8C:
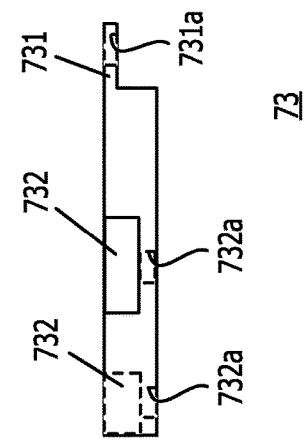
FIGS. 8A to 8D are views illustrating four sides of a cooling plate provided in the electronic device of the fourth exemplary embodiment.
Figure 8A:
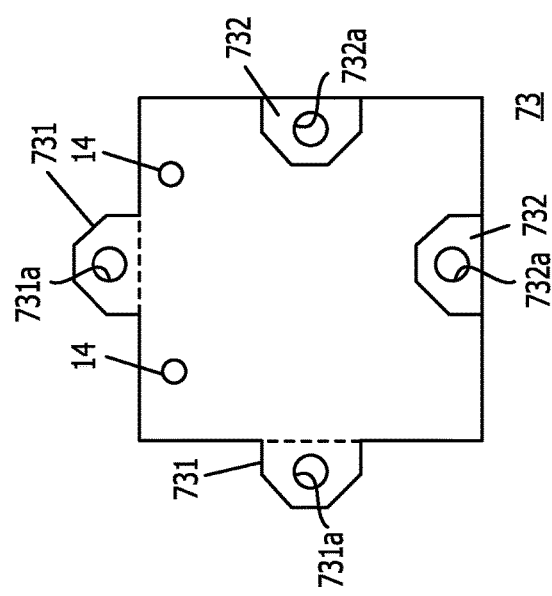
Figure 8B:
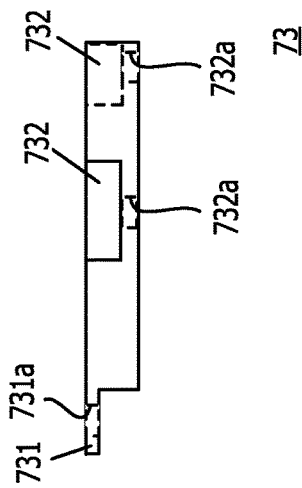
Figure 8D:
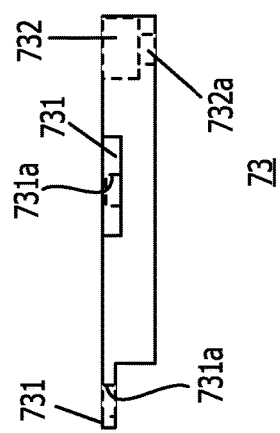

A cooling device 70 of a fourth exemplary embodiment will be described with reference to FIGS. 7A to 8D. FIG. 7A is a plan view of the cooling device 70 provided in an electronic device 100 of the fourth exemplary embodiment, and FIG. 7B is a front view of the cooling device 70. FIGS. 8A to 8D are views illustrating four sides of a cooling plate 73 provided in the electronic device 100 of the fourth exemplary embodiment. FIG. 8A is a plan view, FIG. 8B is a front view, FIG. 8C is a right side view, and FIG. 8D is a left side view.

The cooling device 70 of the fourth exemplary embodiment includes four cooling plates 73 arranged in a square form, specifically, a first cooling plate 73a, a second cooling plate 73b, a third cooling plate 73c and a fourth cooling plate 73d. Each cooling plate 73 includes first overlapping portions 731 and second overlapping portions 732. First insertion holes 731a are provided in the first overlapping portions 731, and second insertion holes 732a are provided in the second overlapping portions 732. The first overlapping portions 731 are protruding portions which protrude laterally from the corresponding cooling plate 73 when the cooling plate 73 is seen from the top side, as illustrated in FIG. 8A. Specifically, the first overlapping portions 731 are formed as protruding portions which protrude laterally from side edges of the rectangular cooling plate 73. The second overlapping portion 732 at one side is a recessed portion in which one of the first overlapping portions 731 as a protruding portion is fitted. The protruding portions are respectively provided at two sides of the rectangular cooling plate 73, and the recessed portions are respectively provided at the other two sides. The first cooling plate 73a and the second cooling plate 73b are coupled to each other by a coupling screw 18a and a fixing nut 18b at a position where side edges of the first cooling plate 73a and the second cooling plate 73b face each other while the first overlapping portion 731 and the second overlapping portion 732 overlap each other so that the protruding portion is fitted in the recessed portion. The second cooling plate 73b and the third cooling plate 73c, the third cooling plate 73c and the fourth cooling plate 73d, and the fourth cooling plate 73d and the first cooling plate 73a are coupled to each other in the same manner as in the first cooling plate 73a and the second cooling plate 73b. At other locations, the cooling plates 73 are fixed to a substrate 11 by fixing screws 19a and fixing nuts 19b.

For example, when four corners of each rectangular cooling plate 73 are screwed, sixteen screwing locations are required to fix four cooling plates 73 to the substrate 11. In contrast, in the cooling device 70 of the fourth exemplary embodiment, since screwing is carried out at twelve locations, regions for four locations may be reduced. Further, electronic components 12 may be disposed to be adjacent to each other, thereby improving the mounting density.

Fifth Exemplary Embodiment

Figure 9:
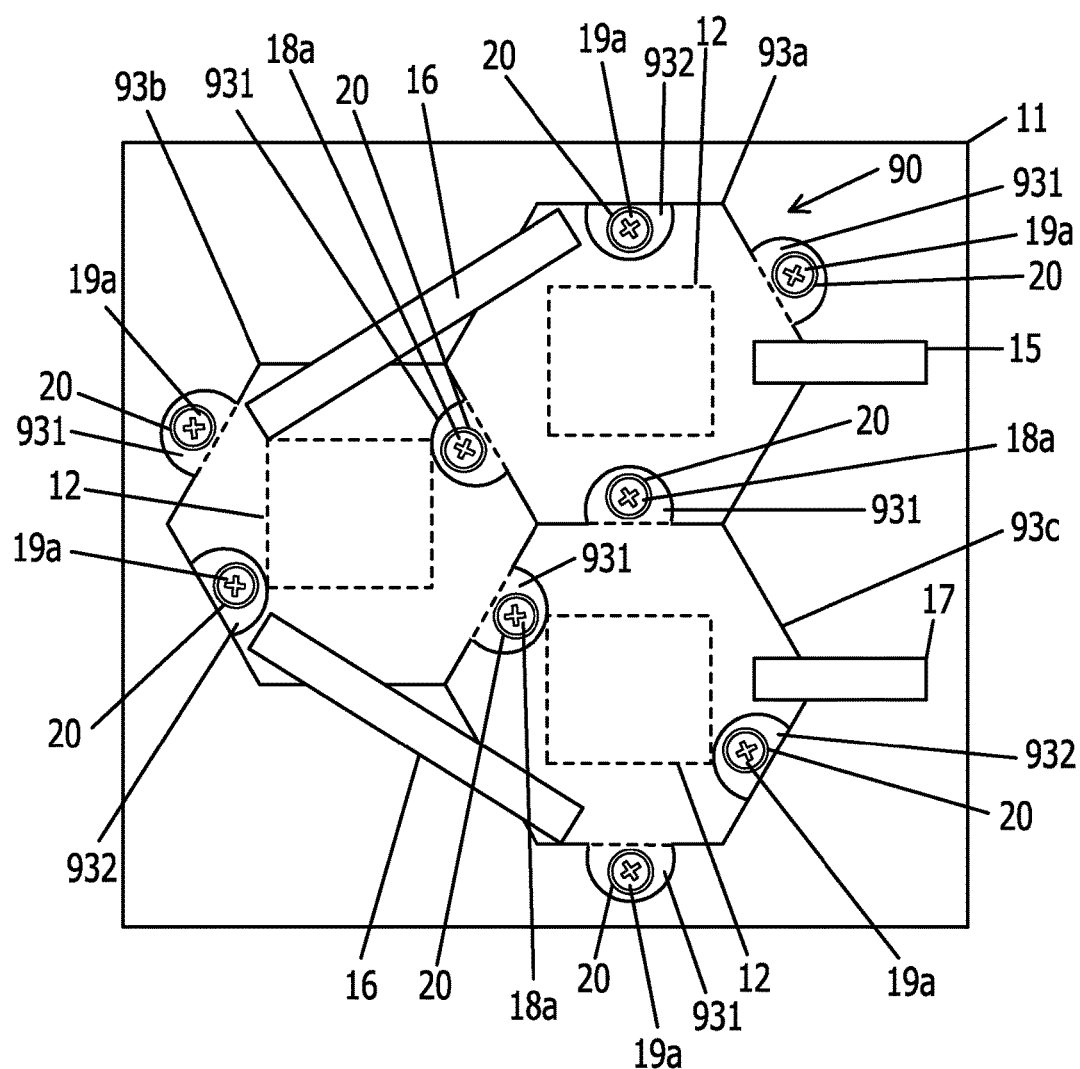
FIG. 9 is a plan view of a cooling device provided in an electronic device of a fifth exemplary embodiment.

Hereinafter, a cooling device 90 of a fifth exemplary embodiment will be described with reference to FIGS. 9 to 10D. FIG. 9 is a plan view of a cooling device 90 provided in an electronic device 100 of the fifth exemplary embodiment. FIGS. 10A to 10D are views illustrating four sides of a cooling plate 93 provided in the electronic device 100 of the fifth exemplary embodiment. FIG. 10A is a plan view, FIG. 10B is a front view, FIG. 10C is a right side view, and FIG. 10D is a left side view.

The cooling device 90 of the fifth exemplary embodiment includes three cooling plates 93 arranged in a triangle form, specifically, a first cooling plate 93a, a second cooling plate 93b and a third cooling plate 93c. Each cooling plate 93 is formed in a hexagonal shape, and includes two first overlapping portions 931 and two second overlapping portions 932. First insertion holes 931a are provided in the first overlapping portions 931, and second insertion holes 932a are provided in the second overlapping portions 932. Here, the first overlapping portions 931 are protruding portions which protrude laterally from the cooling plate 93 when the cooling plate 93 is seen from the top side, as illustrated in FIG. 10A. Specifically, each first overlapping portion 931 is formed as a protruding portion which protrudes laterally from the corresponding side edge of the hexagonal cooling plate 93. The second overlapping portion 932 at one side is a recessed portion in which the first overlapping portion 931 as a protruding portion is fitted. The protruding portions are respectively provided at two sides of the hexagonal cooling plate 93, and the recessed portions are respectively provided at other two sides. The first cooling plate 93a and the second cooling plate 93b are coupled to each other by a coupling screw 18a and a fixing nut 18b at a position where side edges of the first cooling plate 93a and the second cooling plate 93b face each other while the first overlapping portion 931 and the second overlapping portion 932 overlap each other. The second cooling plate 93b and the third cooling plate 93c, and the third cooling plate 93c and the first cooling plate 93a are coupled to each other in the same manner as in the first cooling plate 93a and the second cooling plate 93b. At other locations, the cooling plates 93 are fixed to a substrate 11 by fixing screws 19a and fixing nuts 19b.

With this arrangement, regions used for screwing may also be reduced as compared to a case where each cooling plate is individually screwed. Further, since electronic components 12 may be disposed to be adjacent to each other, the mounting density is improved.

Preferred exemplary embodiments of the present disclosure have been described in detail, but the present disclosure is not limited to the specific exemplary embodiments. Various modification and changes may be made within the scope of the present disclosure described in the appended claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. An electronic device comprising:
a first cooling member including two of first-type overlapping portions in each of which a first insertion hole is formed, and provided to be abutted on a first component to be cooled provided on a substrate;
a second cooling member including two of second-type overlapping portions in each of which a second insertion hole is formed, and provided to be abutted on a second component to be cooled provided on the substrate, one of the second-type overlapping portions overlapping one of the first-type overlapping portions of the first cooling member; and
a coupling member inserted through the first insertion hole of the one of the first-type overlapping portions and the second insertion hole of the one of the second-type overlapping portions to couple the one of the first-type overlapping portion to the one of the second-type overlapping portion through an elastic member,
wherein the first cooling member and the second cooling member are formed in a same polygonal plate shape of a same size having a plurality of sides, each of the first cooling member and the second cooling member being provided with two of the first-type overlapping portions at two first sides of the polygonal plate shape not adjacent to each other, and two of the second-type overlapping portions at two second sides of the polygonal plate shape between the first sides.

2. The electronic device according to claim 1, wherein the coupling member is fixed to the substrate through a third insertion hole provided in the substrate.

3. The electronic device according to claim 1, wherein the first-type overlapping portion and the second-type overlapping portion include stepped portions, respectively, which are engaged with each other.

4. The electronic device according to claim 1, wherein the first-type overlapping portion is a protruding portion which protrudes laterally from the first cooling member when the first cooling member is seen from a top side, and the second-type overlapping portion is a recessed portion in which the protruding portion is fitted.

5. The electronic device according to claim 1, wherein the elastic member is disposed between the first-type overlapping portion and the second-type overlapping portion.

6. The electronic device according to claim 1, further comprising a fixing member configured to fix the first cooling member or the second cooling member to the substrate through an elastic member.

* * * * *